SUBSTRATE SUPPORT MODULE

Filed Oct. 16, 1970

INVENTOR.
FRIEDER H. ENSSLIN
BY
Shlesinger, Fitzsimmons & Shlesinger
ATTORNEYS 3,669,812

SUBSTRATE SUPPORT MODULE

Frieder H. Ensslin, Rochester, N.Y., assignor to The Bendix Corporation, Rochester, N.Y.

Filed Oct. 16, 1970, Ser. No. 81,321
Int. Cl. F25b *29/00*
U.S. Cl. 165—26 7 Claims

ABSTRACT OF THE DISCLOSURE

A substrate support for controlling the temperature of a substrate during outgassing, deposition, sputter etching and bias sputtering, and after deposition. This support comprises a block of thermal conducting material having heating means at one side and cooling means at the opposite side. The material cross section of the block is reduced by a series of holes drilled from two directions into the block at 90° to one another so that a great number of equal size columns equidistantly spaced connect the heated and cooled sides of the block. This permits heating and cooling of a substrate within a very few minutes.

Figure 1:
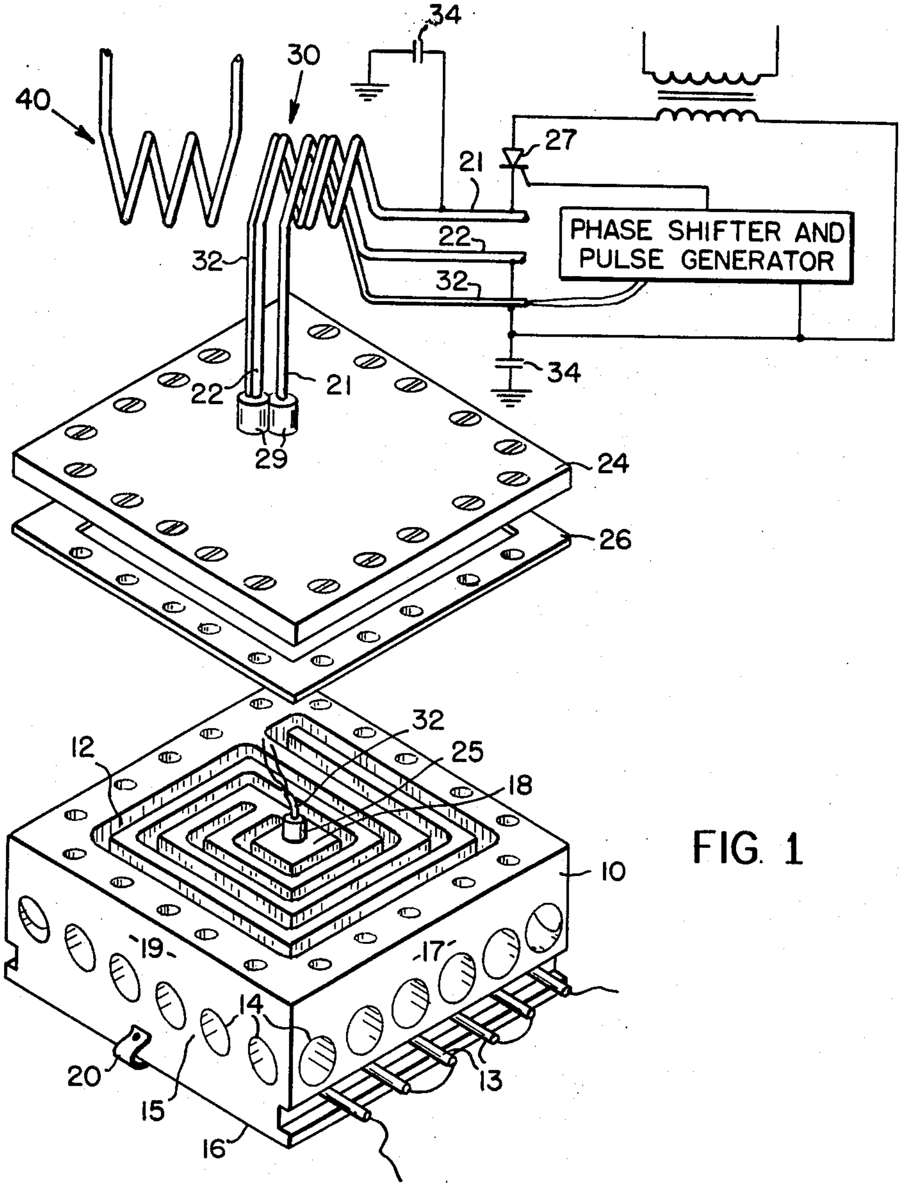

This invention relates to sputtering apparatus and more specifically to a substrate support which is capable of heating or cooling the substrate over a wide range of temperatures during short time intervals.

Sputtering is the process whereby under controlled conditions positive ions, electrically attracted to a target of desired deposition material, release surface atoms of the target deposition material toward a substrate.

Generally, a substrate is processed in the following manner: first, the substrate is placed in a vacuum chamber and heated while subjected to a vacuum. This step vaporizes impurities from the surface of the substrate and is called outgassing. The substrate is then coated with the desired material by sputtering. During the sputtering process the temperature of the substrate increases and it is therefore necessary to cool the substrate before removing it from the system.

An important consideration in the field of vacuum or sputter thin deposition is the substrate temperature which must be closely controlled (1) for outgassing prior to the actual deposition process, (2) for cooling during deposition where undesirable heating is often caused by heat radiation from the vapor source or the plasma of a glow discharge or by secondary or reflected electron bombardment, (3) for rapid cooling of the substrate after deposition in order to shorten the time cycle of the system, since in most instances the deposited film will have to cool to a lower temperature before the substrate can be removed from the vacuum system, and (4) for sputter-etching and bias sputtering. In processing the substrates, the heating of the substrate for outgassing and the final cooling step are the most time-consuming. Because of the time required for these steps, the number of substrates that can be processed over a particular time interval is limited and, at present there are no substrate supports available to shorten these steps.

Accordingly, it is an object of this invention to reduce the time required to process a substrate in a sputtering apparatus. To this end, a prime purpose of the invention is to provide a substrate support whose temperature can be controlled throughout processing.

Another object of the invention is to accelerate the temperature cycle time so that heat-up time and cool-down time will be no longer than a few minutes each.

It is another object of this invention to provide an improved substrate support structure. In this regard a purpose of the invention is to provide a substrate support in which the thermal contact is no longer subject to thermal expansion and contraction of the material of the support.

It is still another object of this invention to improve the performance of a sputtering apparatus.

The above and other objects and features of the invention will become apparent from the following detailed description and claims, particularly when taken in conjunction with the accompanying drawing.

Figure 2:
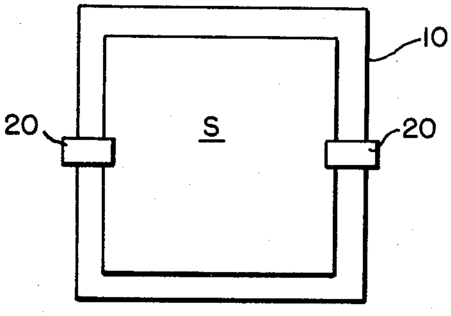

In the drawing:

FIG. 1 is an exploded diagrammatic view of a preferred embodiment of substrate support made according to this invention, showing the cooling and heating connections to the support and controls therefor; and FIG. 2 is a fragmentary view looking at the heater side of the support.

Referring now to the drawing by numerals of reference, 10 designates a block of material having good thermal conductance and good workability, such as aluminum, which is provided with a cooling channel 12 in one end and with an electric heating element 13 in its opposite end. To reduce the thermal conductivity of the block 10 between the cooling channel 12 and the heating element 13 the volume of material between the cooling channel 12 and the heating elements 13 is reduced by a series of holes 14 which are drilled from two directions at 90° to one another, as from adjacent sides 17 and 19 in such manner that a great number of equi-spaced, approximately equal size columns 15 remain, connecting the heated and the cooled portions of the block 10 together. The substrate S which is to receive sputtered material is positioned upon a plane, lapped surface 16 of the block at the heated end thereof. The substrate is held against this lapped surface by leaf springs 20 which can withstand high temperature. A thermocouple 25 for monitoring the temperature of the substrate is inserted through hole 18 in block 10 until it touches the back surface of the substrate. The signal from the thermocouple 25 controls the power supplied to the heating elements 13. In the preferred embodiment a power supply controlled by a silicon controlled rectifier 27 is employed to supply power to the heating elements 13. The cooling channels 12 are fluid-tight and receive and discharge coolant through interwound helical inlet and outlet tubes 21 and 22, respectively, which are adapted to convey a suitable coolant such as water.

In operation, a coolant, such as water, flows continuously through cooling channel 12 while power is supplied to heating elements 13 by a power supply under control of the silicon controlled rectifier 27 which varies the input power in response to a signal from the thermocouple 25 and a predetermined temperature setting. A conventional temperature selector changes the firing point of the silicon controlled rectifier to lower heater power when the preset temperature is approached. Thus the desired temperature may be rapidly obtained without overshooting and without temperature oscillations.

At a fixed power input to the heater and a fixed cooling water flow rate, the ultimately obtainable substrate temperature depends on the size of the holes 14. The larger the holes (and, therefore, the smaller the columns 15), the faster the heat-up will occur. This is due to the fact that removal of some of the thermal conducting material decreases the amount of heat that can be conducted from the heated portion of the module to the cooled portion of the substrate module. Small columns, however, will increase the cool-down time. This means if faster heat-up is wanted but not at the expense of rapid cool-down, the heater power will have to be increased. The more heater elements that are used and the more holes that are drilled to form columns, the better will be the temperature uniformity. The heating and cooling cycle time is proportional to the mass of the heater side of the block. However, making this mass too small will again effect the temperature uniformity disadvantageously.

EXAMPLE

A substrate support module capable of heating up and cooling down a substrate over a 270° C. range (30° C. to 300° C.) within three minutes was built as follows: A block of aluminum 2⅝ inches square was chosen as the basic structural material. This is large enough for a 2" x 2" substrate. A series of holes 5/32 inch in diameter were drilled along one side of the block at a distance of 3/16 inch from the substrate mounting surface 16. Inserted in the holes were ten heater elements fabricated from alumina rod each having two longitudinal holes through the rod for the tantalum heater wire. In this embodiment heating elements were bifilar wires electrically connected in series. This type of electrical arrangement prevented a disturbing magnetic field from forming within the block. The passage 12 for coolant was located in a plane above the heating elements. The passage, about 20 inches in length, was milled into the surface of the block opposite the substrate mounting surface 16. After the passage was milled, a stainless steel plate 24 sealed by a "Teflon" gasket 26 was mounted on the block to form a cooling channel within the block. For discharging and receiving a coolant, tubing 21, 22 communicating with the passage was mounted on the block. To decrease the total thermal conductivity of the substrate support between the cooling means and the heating means holes 11/32 inch in diameter may be drilled into the block at 13/16 inch from the substrate mounting surface 16.

With such a block heat-up time from 30° C. to 300° C. and cool-down time from 300° C. to 30° C. of five minutes each can be achieved; and temperatures can be controlled within ±2% of a preset value anywhere between 150 and 350° C.

It was necessary to connect this substrate holder, which required cooling water, heater power, and a thermocouple, to RF power. For this purpose in what is a presently preferred embodiment of the invention, one of the two cooling water tubes was brazed into the stainless steel cover for the cooling channels in the aluminum block. The other tube was connected to the same cover through a tubular ceramic feed-through insulator with metal end seals. These two cooling water tubes are conducted out of the vacuum system through two separate feedthrough insulators 29. Just outside the vacum system, these two tubes are wound together into one secondary coil 30 of an RF-transformer. Care was taken that the two parallel coils did not touch each other. This was done by sliding insulating tubing over one of the tubes before coiling them up. In parallel to the cooling water tube connecting directly to the cooling channel cover, a smaller tube 32 was brazed prior to assembly and coiling. This tube serves as a duct for the thermocouple leads. The free ends of the coiled up tubings are RF-grounded through capacitors 34. This allows the cooling water to enter and exit at RF-ground potential, so does the thermocouple. The ends of the coils were not directly grounded to allow for DC biasing. Where that is not desired, the cooling water tube-thermocouple duct tube pair could be directly connected to ground. The power supply for the heater is connected at the water inlet and outlet of the coil. One of the heater wires connects directly to the aluminum block and the other wire to the water tubing just above the insulator on the cover flange for the cooling water channel. The coiled up tubes now act as one secondary RF-coil but at the same time fulfill three additional functions, that of a water cooling duct with inlet and outlet at RF-ground, a double conductor for the heater power terminating at RF-ground, and a duct for the thermocouple lead transferring the thermocouple signal from the RF-potential of the substrate to RF-ground.

The primary RF-coil 40 was in our case the tank coil of the final RF-amplifier but could also be a coil matching the impedance of an RF-cable to the impedance of the target.

While a preferred embodiment of the invention has been disclosed it will be apparent to those skilled in the art that changes may be made and in some cases, certain features of the invention may be used to advantage without corresponding use of other features. For example, the thermoconductivity of that portion of the module between the cooled portion and the heated portion of the module may be changed by the insertion of one or more materials having a thermal conductivity different from that of the material which comprises the module. Further, the spacing between the plane in which the heating elements are located and the plane in which the cooling channel is located may be decreased to decrease the time required to lower the temperature of the substrate. This application is intended to cover any modifications, variations, or adaptations of the invention that come within the disclosure or the recital of the appended claims, and that are apparent to those skilled in the art.

Having thus described my invention, what I claim is:

1. A substrate support for sputtering apparatus comprising an assembly including a holder for the substrate made of thermal conducting material, means for cooling said holder, means for heating said holder, means for controlling said cooling and heating means to maintain the temperature of a substrate mounted on said holder within a predetermined range, said holder having one face on which the substrate is mounted, said heating means being disposed in one end of said holder adjacent said one face, said cooling means being disposed in the opposite end of said holder, and said holder being a block of thermal conducting material, and said block having a first plurality of openings extending therethrough in one direction and a second plurality of openings extending therethrough in a direction at right angles to said first plurality of openings, all said openings being located between said cooling means and said heating means to decrease the thermal conductivity of said block.

2. A substrate support as claimed in claim 1, wherein the openings of the first group are equi-spaced from one another and the openings of the second group are also equi-spaced from one another.

3. A substrate support for sputtering apparatus comprising a block of thermal conducting material, heating means for said block including a heater disposed in said block adjacent one face thereof, cooling means for said block including means for circulating a coolant through said block adjacent the opposite face thereof, means including a thermocouple for controlling the temperature of said block and said cooling and heating means, means for securing a substrate to said one face of said block, said cooling means including two interwound helical tubes connected to a coolant supply and to said block, one of said tubes serving to conduct coolant to said block, and the other tube serving to drain coolant therefrom, said tubes being electrically conducting and constituting the secondary coil of a transformer, the primary coil of which is mounted in operative relation to said secondary coil.

4. A substrate support as claimed in claim 3, wherein said two tubes are insulated from one another.

5. A substrate support as claimed in claim 3, wherein said two tubes are insulated from one another and both are grounded.

6. A substrate support as claimed in claim 3, wherein the feed wires of said thermocouple are carried in a tube which is interwound with one of the two first-named tubes.

7. A substrate support as claimed in claim 3, wherein all said tubes are grounded exteriorly of said block.

References Cited

UNITED STATES PATENTS 3,369,989 2/1968 Kay et al. ............ 118—59

CHARLES SUKALO, Primary Examiner

U.S. Cl. X.R.

165—80